(12) United States Patent
Chainer et al.

(10) Patent No.: US 10,499,543 B2
(45) Date of Patent: *Dec. 3, 2019

(54) TWO-PHASE LIQUID COOLED ELECTRONICS

(71) Applicant: International Business Machines Corporation, Armonk, NY (US)

(72) Inventors: Timothy Joseph Chainer, Putnam Valley, NY (US); Pritish Ranjan Parida, Fishkill, NY (US); Mark Delorman Schultz, Ossining, NY (US)

(73) Assignee: INTERNATIONAL BUSTNESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/841,752

(22) Filed: Dec. 14, 2017

(65) Prior Publication Data

US 2018/0270990 A1    Sep. 20, 2018

Related U.S. Application Data

(63) Continuation of application No. 15/463,231, filed on Mar. 20, 2017.

(51) Int. Cl.
H05K 7/20 (2006.01)
G06F 1/20 (2006.01)
(Continued)

(52) U.S. Cl.
CPC .......... *H05K 7/20381* (2013.01); *G06F 1/20* (2013.01); *G06F 1/206* (2013.01); *G06F 1/3206* (2013.01);
(Continued)

(58) Field of Classification Search
CPC . H05K 7/2029; H05K 7/20309–20327; H05K 7/20381; H05K 7/20663–20672;
(Continued)

(56) References Cited

U.S. PATENT DOCUMENTS 6,496,367 B2 * 12/2002 Donahoe ................. G06F 1/203
361/679.46
6,519,955 B2   2/2003 Marsala
(Continued)

FOREIGN PATENT DOCUMENTS

WO    9211494    7/1992

OTHER PUBLICATIONS

Marcinichen, et al., "On-chip two-phase cooling of datacenters: Cooling system and energy recovery evaluation," Applied Thermal Engineering 41 (2012), pp. 36-51.
(Continued)

*Primary Examiner* — Robert J Hoffberg
(74) *Attorney, Agent, or Firm* — Amin, Turocy & Watson, LLP

(57) ABSTRACT

Techniques that facilitate two-phase liquid cooling electronics are provided. In one example, a server system comprises a two-phase cooling system and an air moving system. The two-phase cooling system reduces a first temperature of a first electronic component in the server system using a pump that circulates a coolant refrigerant through a two-phase refrigerant loop associated with the first electronic component, where first electronic component satisfies a first defined criterion. The air moving system reduces a second temperature of a second electronic component in the server system using one or more fans associated with the second electronic component, where the second electronic component satisfies a second defined criterion.

11 Claims, 10 Drawing Sheets

(51) Int. Cl.
*G06F 1/3206* (2019.01)
*H01L 23/473* (2006.01)
*H01L 23/467* (2006.01)
*H01L 23/427* (2006.01)

(52) U.S. Cl.
CPC .......... *H01L 23/427* (2013.01); *H01L 23/467* (2013.01); *H01L 23/473* (2013.01); *H05K 7/208* (2013.01); *H05K 7/20136* (2013.01); *H05K 7/20145* (2013.01); *H05K 7/20209* (2013.01); *H05K 7/20309* (2013.01); *H05K 7/20318* (2013.01); *H05K 7/20327* (2013.01); *H05K 7/20509* (2013.01); *H05K 7/20727* (2013.01); *H05K 7/20809* (2013.01); *H05K 7/20836* (2013.01)

(58) Field of Classification Search
CPC ....... H05K 7/207; H05K 7/208–20809; H05K 7/20836; G06F 1/206
See application file for complete search history.

(56) References Cited

U.S. PATENT DOCUMENTS

| | | | |
|---|---|---|---|
| 6,679,081 B2 | 1/2004 | Marsala | |
| 6,741,469 B1 | 5/2004 | Monfarad | |
| 7,024,573 B2 | 4/2006 | Patel et al. | |
| 7,486,513 B2 | 2/2009 | Hall et al. | |
| 7,866,173 B2 | 1/2011 | Brunschwiler et al. | |
| 7,957,132 B2* | 6/2011 | Fried | F28D 15/0266 165/185 |
| 8,014,150 B2* | 9/2011 | Campbell | H05K 7/20809 165/104.33 |
| 8,117,854 B2 | 2/2012 | Lampe et al. | |
| 8,170,724 B2* | 5/2012 | Kelley | H05K 7/2079 340/501 |
| 8,194,406 B2 | 6/2012 | Campbell et al. | |
| 8,351,200 B2 | 1/2013 | Arimilli et al. | |
| 8,422,218 B2* | 4/2013 | Fried | F28D 15/0266 361/679.47 |
| 8,724,315 B2* | 5/2014 | Branton | H05K 7/20754 165/104.33 |
| 8,749,968 B1* | 6/2014 | Branton | H05K 7/20754 165/80.4 |
| 8,787,015 B2 | 7/2014 | El-Essawy et al. | |
| 8,899,060 B2 | 12/2014 | Hall et al. | |
| 9,089,078 B2* | 7/2015 | Branton | H05K 7/20754 |
| 9,250,636 B2* | 2/2016 | Chainer | G06F 1/206 |
| 9,261,308 B2* | 2/2016 | Campbell | F28F 3/048 |
| 9,261,310 B2* | 2/2016 | Fried | F28D 15/0266 |
| 9,357,675 B2* | 5/2016 | Campbell | H05K 7/20318 |
| 9,420,729 B2* | 8/2016 | Kelley | H05K 7/2079 |
| 9,750,165 B2* | 8/2017 | Chainer | G06F 1/206 |
| 10,136,554 B2* | 11/2018 | Chainer | H05K 7/2029 |
| 10,143,109 B2* | 11/2018 | Chainer | H05K 7/2029 |
| 2004/0190253 A1 | 9/2004 | Prasher et al. | |
| 2007/0193300 A1 | 8/2007 | Tilton et al. | |
| 2008/0066889 A1 | 3/2008 | Knight et al. | |
| 2012/0097370 A1 | 4/2012 | Correa | |
| 2012/0194996 A1 | 8/2012 | El-Essawy et al. | |
| 2013/0255925 A1 | 10/2013 | Koontz et al. | |
| 2015/0319883 A1* | 11/2015 | Branton | H05K 7/20754 361/679.53 |
| 2016/0330875 A1* | 11/2016 | Kelley | H05K 7/2079 |
| 2017/0231118 A1* | 8/2017 | Cader | H05K 7/20381 |
| 2017/0234623 A1* | 8/2017 | Fried | F28D 15/0266 165/104.26 |
| 2018/0066663 A1* | 3/2018 | Kulkarni | H05K 7/20327 |

OTHER PUBLICATIONS

Office Action dated Apr. 6, 2018 for U.S. Appl. No. 15/463,231, 35 pages.
Office Action dated Jul. 12, 2018 for U.S. Appl. No. 15/463,231, 43 pages.

* cited by examiner

TWO-PHASE LIQUID COOLED ELECTRONICS

STATEMENT REGARDING FEDERALLY SPONSORED RESEARCH OR DEVELOPMENT

This invention was made with Government support under Contract No.: FA8650-14-C-7466 awarded by Defense Advanced Research Projects Agency (DARPA). The Government has certain rights to this invention.

BACKGROUND

The subject disclosure relates to liquid cooling systems, and more specifically, to two-phase cooling systems for electronics.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, methods, apparatuses and/or devices that facilitate two-phase cooling for electronics are described.

According to an embodiment, a server system can comprise a two-phase cooling system and an air moving system. The two-phase cooling system can reduce a first temperature of a first electronic component in the server system using a pump that circulates a coolant refrigerant through a two-phase refrigerant loop associated with the first electronic component. The first electronic component satisfies a first defined criterion. The air moving system can reduce a second temperature of a second electronic component in the server system using one or more fans associated with the second electronic component. The second electronic component satisfies a second defined criterion.

According to another embodiment, a system can comprise an enclosure and a controller. The enclosure can comprise a two-phase cooling system, an air moving system and one or more sensors. The two-phase cooling system can reduce a first temperature of a first electronic component in the enclosure using a pump that circulates a coolant refrigerant through a two-phase refrigerant loop associated with the first electronic component. The air moving system can reduce a second temperature of a second electronic component in the enclosure using one or more fans associated with the second electronic component. The one or more sensors can monitor the two-phase cooling system. The controller can regulate one or more control valves associated with the two-phase cooling system based on data provided by the one or more sensors.

According to yet another embodiment, a computer-implemented method is provided. The computer-implemented method can comprise monitoring, by a system operatively coupled to a processor, one or more sensors associated with a two-phase cooling system that reduces a first temperature of a first electronic component using a pump that circulates a coolant refrigerant through a two-phase refrigerant loop associated with the first electronic component. The two-phase cooling system and an air moving system can reduce a second temperature of a second electronic component using one or more fans are contained in an enclosure. The computer-implemented method can further comprise regulating, by the system, one or more control valves associated with the two-phase cooling system based on data provided by the one or more sensors.

DETAILED DESCRIPTION

Figure 1:
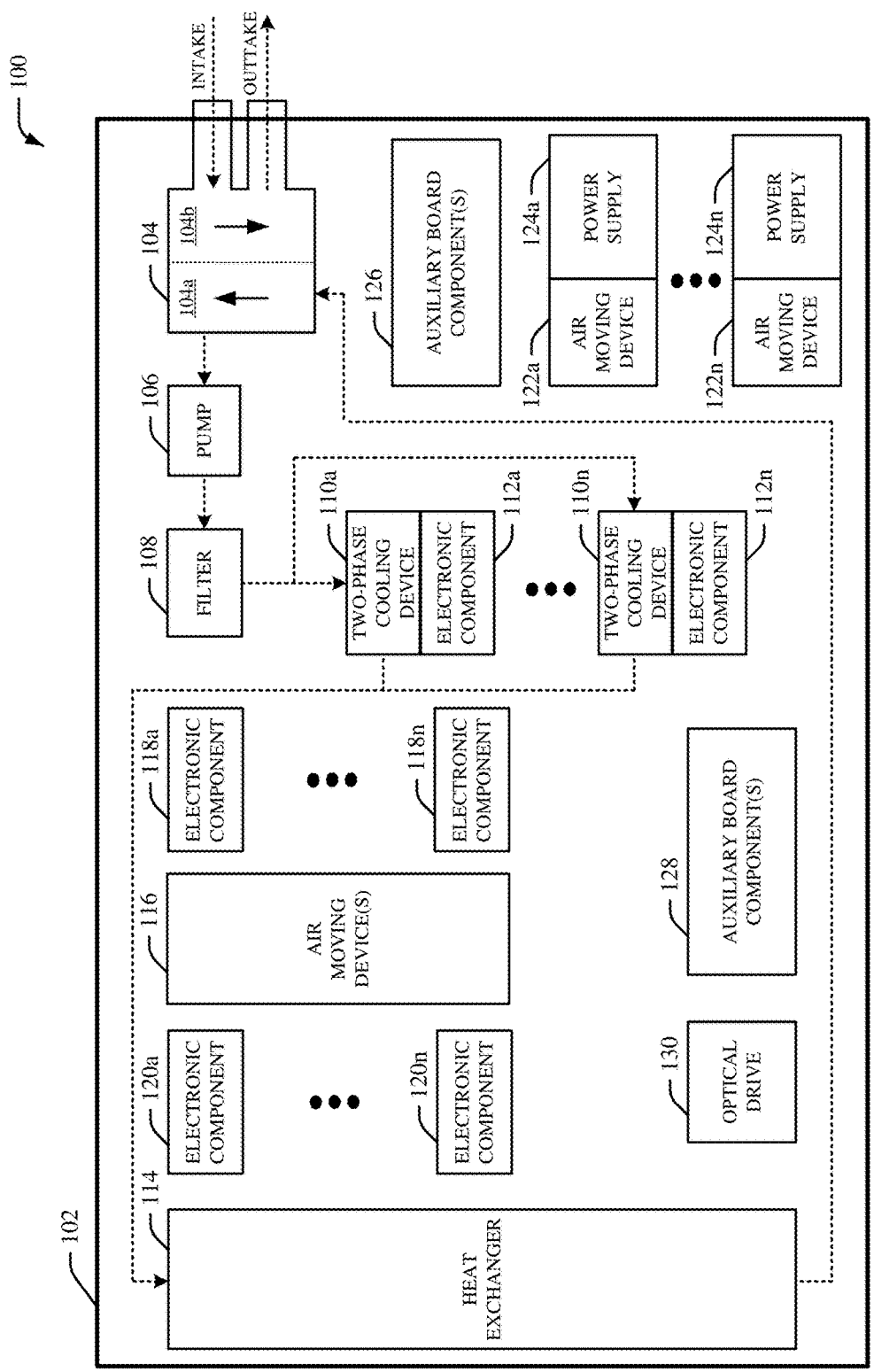
FIG. 1 illustrates a block diagram of an example, non-limiting system associated with two-phase liquid cooling in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

In electronic systems, it is generally important to maintain a temperature of electronic components within a certain temperature range. Often times, one or more fans are employed to reduce a temperature of the electronic components. For example, a server enclosure with one or more electronic components can be air-cooled with one or more fans to provide air flow inside the server enclosure. However, cooling electronic components in a server enclosure with one or more fans is generally inefficient. Furthermore, power usage of one or more fans in a server enclosure can increase when an external temperature surrounding the server enclosure increases. Moreover, power usage of one or more fans in a server enclosure is generally a large percentage of total power employed by a server system associated with a server enclosure.

Embodiments described herein include systems, methods, apparatuses and devices that facilitate two-phase liquid cooling for electronic components. For example, a server-level implementation of two-phase liquid cooling of one or more electronic components can be provided. In an aspect, one or more electronic components in an enclosure (e.g., a server enclosure) can be cooled by a two-phase cooling system (e.g., chip-embedded two-phase cooling or a two-phase cooling cold-plate). The one or more electronic components cooled by the two-phase cooling system can be high-powered electronic components and/or high-density electronic components such as, for example, processors (e.g., central processing units, microprocessors, etc.). Additionally, one or more other electronic components in the enclosure (e.g., the server enclosure) can be cooled by an air moving system (e.g., a re-circulating air loop associated with one or more fans). The one or more other electronic components cooled by the air moving system can be low-powered electronic components and/or low-density electronic components such as, for example, memory components (e.g., memory modules, hard disk drives, etc.) and/or power supplies. In an embodiment, heat from air within the enclosure (e.g., the server enclosure) can captured and provided to the two-phase cooling system via a heat exchanger (e.g., an air-to-liquid heat exchanger). As such, thermal management of one or more electronic components within an enclosure can be improved, performance (e.g., processing performance) of one or more electronic components within an enclosure can be improved, and/or damage to one or more electronic components within an enclosure can be avoided. For example, temperature of one or more electronic components within an enclosure can be efficiently reduced and/or a temperature of one or more electronic components within an enclosure can be efficiently maintained within a certain range of temperatures. Furthermore, efficiency of a two-phase cooling system and/or an air moving system can be improved. Moreover, approximately 100% of heat generated by one or more electronic components within an enclosure can be captured by a recirculating two-phase coolant loop and operating exit vapor quality for a two-phase cooling system can be improved. For example, an operating exit vapor quality over 95% can be achieved. As used herein, "operating exit vapor quality" can refer to a percentage representation of a mass of coolant in a vapor phase divided by total mass of the coolant.

FIG. 1 illustrates a block diagram of an example, non-limiting system 100 that facilitates two-phase liquid cooling in accordance with one or more embodiments described herein. The system 100 can be, for example, a server system. In various embodiments, the system 100 can employ a two-phase liquid cooling system and an air moving system within an enclosure (e.g., a server enclosure, an electronic component enclosure, etc.) that contains electronic components. The system 100 can employ a two-phase liquid cooling system and an air moving system that is highly technical in nature. Further, the system 100 can be employed to solve new problems that arise through advancements in technology, two-phase cooling systems and/or computer architecture, and the like. One or more embodiments of the system 100 can provide technical improvements to an electronic component and/or a two-phase cooling system by at least providing energy efficient cooling of one or more electronic components, improving computational efficiency of one or more electronic components, improving processing performance of one or more electronic components, reducing total power of a computer system associated with one or more electronic components, improving thermal management of one or more electronic components, reducing a temperature of one or more electronic components, improving flow of coolant fluid through a two-phase cooling system, decreasing an amount of pressure drop associated with a two-phase cooling system, and/or improving energy efficiency of a two-phase cooling system. Additionally or alternatively, one or more embodiments of the system 100 can provide technical improvements to server systems, data center systems, digital distribution systems, data analysis systems, digital systems and/or other systems.

In the embodiment shown in FIG. 1, the system 100 can include an enclosure 102. The enclosure 102 can be, for example, an electronic enclosure (e.g., an electrical enclosure) that contains electronic components. In one example, the enclosure 102 can be a server enclosure. The enclosure 102 can include a two-phase cooling system that includes a condenser 104, a pump 106, a filter 108, one or more two-phase cooling devices 110a-n, one or more electronic components 112a-n, and/or a heat exchanger 114. The condenser 104 can include an inner refrigerant loop 104a and an external coolant loop 104b. In an embodiment, the condenser 104 can include four ports (e.g., an enclosure-side coolant inlet associated with the inner refrigerant loop 104a, an enclosure-side coolant outlet associated with the inner refrigerant loop 104a, a facility-side coolant intake associated with the external coolant loop 104b, and a facility-side coolant outlet associated with the external coolant loop 104b). As used herein, "enclosure-side" can refer to a location within the enclosure 102 and "facility-side" can refer to a location outside the enclosure 102. The condenser 104 can receive an intake (e.g., INTAKE shown in FIG. 1). The intake can be a facility-side coolant such as, for example, cool air or cool liquid received from an external source to facilitate heat exchange across the condenser 104. The external coolant loop 104b of the condenser 104 can provide supply and return of the facility-side coolant. In one example, the condenser 104 can be an air-cooled condenser where the facility-side coolant is air. In another example, the condenser 104 can be a liquid-cooled condenser where the facility-side coolant is liquid. The inner refrigerant loop 104a of the condenser 104 can facilitate providing coolant refrigerant through a coolant refrigerant loop within the enclosure 102. The inner refrigerant loop 104a of the condenser 104 can be implemented without interaction with the external coolant loop 104b of the condenser 104. In an aspect, the condenser 104 can condense the enclosure-side intake associated with the inner refrigerant loop 104a into a liquid. The coolant refrigerant can be a liquid coolant. In some embodiments, the coolant refrigerant can be a liquid dielectric coolant. For example, the coolant refrigerant can be a liquid dielectric coolant such as a refrigerant (e.g., R1234ze, R134a, R245fa, etc.) or another type of liquid dielectric coolant (e.g., ammonia, etc.). In certain embodiments, the condenser 104 can condense, to a liquid phase, a portion of the coolant refrigerant associated with a vapor phase. The condenser 104 can be, for example, an air-cooled condenser. Alternatively, the condenser 104 can be, for example, a liquid-cooled condenser. The coolant refrigerant from the condenser 104 can be transferred to the one or more two-phase cooling devices 110a-n via the pump 106 and/or the filter 108. For example, coolant refrigerant from the condenser 104 can be pumped into the one or more two-phase cooling devices 110a-n via the pump 106. In certain embodiments, the filter 108 can be implemented between the pump 106 and the one or more two-phase cooling devices 110a-n to remove debris or residue from the coolant refrigerant provided to the one or more two-phase cooling devices 110a-n. As such, the pump 106 can circulate the coolant refrigerant through a two-phase refrigerant loop associated with the one or more electronic components 112a-n.

The one or more two-phase cooling devices 110a-n can be one or more apparatuses employed to facilitate cooling of the one or more electronic components 112a-n. In one example, the one or more two-phase cooling devices 110a-n can be one or more cold plate devices (e.g., one or more two-phase cooling cold plates) employed to facilitate cooling of the one or more electronic components 112a-n. In an embodiment, the one or more two-phase cooling devices 110a-n can be coupled to the one or more electronic components 112a-n. For instance, the one or more two-phase cooling devices 110a-n can be coupleable and/or coupled to the one or more electronic components 112a-n. In another embodiment, the one or more two-phase cooling devices 110a-n can be formed within the one or more electronic components 112a-n. For instance, the one or more two-phase cooling devices 110a-n can be embedded in the one or more electronic components 112a-n to facilitate chip-embedded two-phase cooling. The one or more electronic components 112a-n can be one or more electronic devices. For example, the one or more electronic components 112a-n can be one or more electronic device packages (e.g., one or more electronic chip package). In one example, the one or more electronic components 112a-n can be one or more processors (e.g., one or more central processing units, one or more microprocessors, etc.). In another example, the one or more electronic components 112a-n can be one or more processor cores (e.g., one or more complementary metal oxide semiconductor (CMOS) processor cores). In an embodiment, the one or more two-phase cooling devices 110a-n can be formed via a three-dimensional (3D) printing process. For example, in some embodiments, the one or more electronic components 112a-n can be one or more 3D stacked electronic chips. In one example, one or more layer of the one or more two-phase cooling devices 110a-n can be 3D printed.

As mentioned above, the one or more two-phase cooling devices 110a-n can be employed as a cooling mechanism for the one or more electronic components 112a-n. For instance, the one or more electronic components 112a-n can be a heat source. The one or more electronic components 112a-n can typically generate heat in response to being operated (e.g., being in a powered on state) and/or in response to processing data. The heat generated by the one or more electronic components 112a-n can be generated as a function of properties for the one or more electronic components 112a-n such as, for example, power dissipation properties for the one or more electronic components 112a-n, density of the one or more electronic components 112a-n, geometric dimensions for the one or more electronic components 112a-n, structural properties for the one or more electronic components 112a-n, electrical properties for the one or more electronic components 112a-n, power consumption of the one or more electronic components 112a-n, or the like. Therefore, heat generated by the one or more electronic components 112a-n can be dissipated via the one or more two-phase cooling devices 110a-n. In an aspect, the one or more electronic components 112a-n can be one or more electronic devices that satisfy a defined criterion. A defined criterion can be associated with a property for the one or more electronic components 112a-n as mentioned above. In one example, a defined criterion associated with the one or more electronic components 112a-n can be, for example, a defined power level for the one or more electronic components 112a-n. In another example, a defined criterion associated with the one or more electronic components 112a-n can be, for example, a defined density level for the one or more electronic components 112a-n.

In an embodiment, the coolant refrigerant that is condensed at and exited from the condenser 104 can be received by the one or more two-phase cooling devices 110a-n to facilitate dissipation of heat generated by the one or more electronic components 112a-n. The coolant refrigerant (e.g., the condensed coolant refrigerant) that exits the condenser 104 can flow through the one or more two-phase cooling devices 110a-n. Furthermore, the coolant refrigerant can be employed by the one or more two-phase cooling devices 110a-n to reduce a temperature of the one or more two-phase cooling devices 110a-n and/or to dissipate the heat generated by the one or more two-phase cooling devices 110a-n in various embodiments. The coolant refrigerant provided to the one or more two-phase cooling devices 110a-n can be transformed into a liquid-vapor mixture (e.g., a two-phase mixture) as the liquid coolant flows through the one or more two-phase cooling devices 110a-n. The coolant refrigerant that flows through the one or more two-phase cooling devices 110a-n can also be provided to the heat exchanger 114. The heat exchanger 114 can cool the coolant refrigerant provided to the heat exchanger 114. For instance, the heat exchanger 114 can employ air to cool the coolant refrigerant provided to the heat exchanger 114. The heat exchanger 114 can provide the coolant refrigerant cooled by the air to the condenser 104 to complete the two-phase refrigerant loop. In an embodiment, the heat exchanger 114 can transfer heat from hot air within the enclosure 102 to the coolant refrigerant (e.g., a liquid/vapor mixture) to facilitate cooling of air within the enclosure 102. Air cooled by the heat exchanger 114 can be further circulated within the enclosure 102 via the one or more air moving devices 116 and/or the one or more air moving devices 122a-n to cool the one or more electronic components 118a-n, the one or more electronic components 120a-n, and/or the one or more power supplies 124a-n. As used herein, an "air moving device" can be a device such as a fan and, in certain embodiments, a heat sink attached to an electronic component. In another embodiment, the condenser 104 can condense vapors associated with the coolant refrigerant to a liquid phase. Furthermore, the pump 106 can pump the coolant refrigerant that is condensed by the condenser 104 into the liquid phase back into the one or more electronic components 112a-n via the one or more two-phase cooling devices 110a-n.

The enclosure 102 can also include an air moving system that includes one or more air moving devices 116, one or more electronic components 118a-n, and/or one or more electronic components 120a-n. The one or more air moving devices 116 can be employed to reduce a temperature of the one or more electronic components 118a-n, and/or the one or more electronic components 120a-n via air moving. In one example, the one or more air moving devices 116 can be one or more fans that can be employed as a cooling mechanism for the one or more electronic components 118a-n, and/or the one or more electronic components 120a-n. In an aspect, the one or more electronic components 118a-n can be a heat source. The one or more electronic components 118a-n can typically generate heat in response to being operated (e.g., being in a powered on state) and/or in response to processing data. The heat generated by the one or more electronic components 118a-n can be generated as a function of properties for the one or more electronic components 118a-n such as, for example, power dissipation properties for the one or more electronic components 118a-n, density of the one or more electronic components 118a-n, geometric dimensions for the one or more electronic components 118a-n, structural properties for the one or more electronic components 118a-n, electrical properties for the one or more electronic components 118a-n, power consumption of the one or more electronic components 118a-n, or the like. Therefore, heat generated by the one or more electronic components 118a-n can be dissipated via the one or more air moving devices 116. In an aspect, the one or more electronic components 118a-n can be one or more electronic devices that satisfy a defined criterion. A defined criterion can be associated with a property for the one or more electronic components 118a-n as mentioned above. In one example, a defined criterion associated with the one or more electronic components 118a-n can be, for example, a defined power level for the one or more electronic components 118a-n. In another example, a defined criterion associated with the one or more electronic components 118a-n can be, for example, a defined density level for the one or more electronic components 118a-n. In an embodiment, the one or more electronic components 118a-n can be, for example, one or more memory devices (e.g., one or more volatile memory devices, one or more non-volatile memory devices, etc.).

In another aspect, the one or more electronic components 120a-n can be a heat source. The one or more electronic components 120a-n can typically generate heat in response to being operated (e.g., being in a powered on state) and/or in response to processing data. The heat generated by the one or more electronic components 120a-n can be generated as a function of properties for the one or more electronic components 120a-n such as, for example, power dissipation properties for the one or more electronic components 120a-n, density of the one or more electronic components 120a-n, geometric dimensions for the one or more electronic components 120a-n, structural properties for the one or more electronic components 120a-n, electrical properties for the one or more electronic components 120a-n, power consumption of the one or more electronic components 120a-n, or the like. Therefore, heat generated by the one or more electronic components 120a-n can be dissipated via the one or more air moving devices 116. In an aspect, the one or more electronic components 120a-n can be one or more electronic devices that satisfy a defined criterion. A defined criterion can be associated with a property for the one or more electronic components 120a-n as mentioned above. In one example, a defined criterion associated with the one or more electronic components 120a-n can be, for example, a defined power level for the one or more electronic components 120a-n. In another example, a defined criterion associated with the one or more electronic components 120a-n can be, for example, a defined density level for the one or more electronic components 120a-n. In an embodiment, the one or more electronic components 118a-n can be, for example, one or more memory disk drives (e.g., one or more hard disk drives, etc.). Additionally or alternatively, the air moving system of the enclosure 102 can include one or more air moving devices 122a-n and one or more power supplies 124a-n. The one or more air moving devices 122a-n can be employed to reduce a temperature of the one or more power supplies 124a-n via air moving. In one example, the one or more air moving devices 122a-n can be one or more fans that can be employed as a cooling mechanism for the one or more power supplies 124a-n.

In an embodiment, the heat exchanger 114 can include a first section associated with an inlet and an outlet for a first coolant from which heat is removed, and a second section associated with an intake and an outtake for a second coolant which can be employed to extract heat. In certain embodiments, the heat exchanger 114 can be an air-to-liquid heat exchanger (e.g., an evaporator). The heat exchanger 114 can be employed to capture heat from air (e.g., a first coolant) associated with the one or more air moving devices 116 and/or the one or more air moving devices 122a-n. The heat exchanger 114 can also provide the heat associated with the one or more air moving devices 116 and/or the one or more air moving devices 122a-n into the two-phase refrigerant loop associated with the condenser 104. For example, the heat exchanger 114 can transfer heat, from air in the enclosure 102 associated with the one or more air moving devices 116 and/or the one or more air moving devices 122a-n, to the two-phase refrigerant loop associated with the condenser 104. The two-phase refrigerant loop associated with the condenser 104 can be associated with a refrigerant (e.g., a second coolant such as, for example, R1234ze). Intake for the inner refrigerant loop 104a of the condenser 104 can be a liquid coolant (e.g., a warm liquid coolant), a liquid/vapor mix, or vapor (e.g., hot vapor). The condenser 104 can condense the liquid coolant received at the intake of the inner refrigerant loop 104a into a liquid. As such, 100% of the heat generated by the one or more electronic components 112a-n, the one or more electronic components 118a-n and/or the one or more electronic component 120a-n can be captured. Furthermore, the two-phase refrigerant loop can provide improved exit vapor quality (e.g., the two-phase refrigerant loop can operate at up to 100% exit vapor quality without any risk of a dry-out condition). In certain embodiments, the enclosure 102 can also include other electronic components such as, for example, one or more auxiliary board components 126, one or more auxiliary board components 128 and/or an optical drive 130. In an aspect, the one or more auxiliary board components 126, the one or more auxiliary board components 128 and/or the optical drive 130 can be coupled to and/or in communication with the one or more electronic components 112a-n, the one or more electronic components 118a-n, the one or more electronic components 120a-n and/or the one or more power supplies 124a-n. In an embodiment, the condenser 104 can provide an outtake (e.g., outtake shown in FIG. 1). The outtake can be, for example, hot air or hot liquid associated with the external coolant loop 104b.

Figure 2:
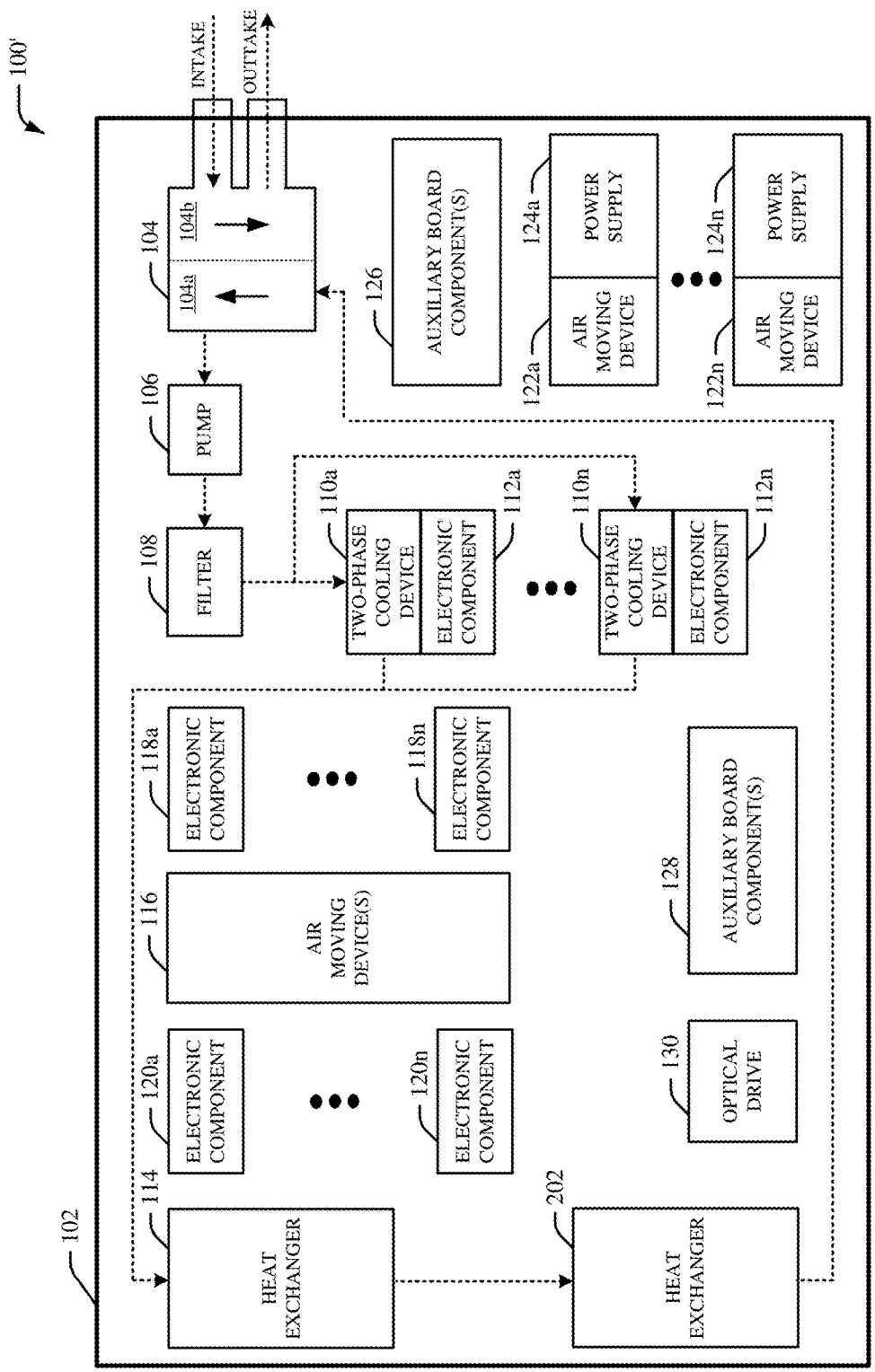
FIG. 2 illustrates a block diagram of another example, non-limiting system associated with two-phase liquid cooling in accordance with one or more embodiments described herein.

FIG. 2 illustrates a block diagram of an example, non-limiting system 100' that facilitates two-phase liquid cooling in accordance with one or more embodiments described herein. The system 100' can be an alternate embodiment of the system 100. Repetitive description of like elements employed in other embodiments described herein is omitted for sake of brevity.

In an embodiment shown in FIG. 2, the enclosure can additionally include a heat exchanger 202. The heat exchanger 202 can be an air-to-liquid heat exchanger (e.g., an evaporator). In an aspect, the heat exchanger 202 can be implemented in the two-phase refrigerant loop between the heat exchanger 114 and the condenser 104. The heat exchanger 202 can be employed, in addition to the heat exchanger 114, to further capture air associated with the one or more air moving devices 116 and/or the one or more air moving devices 122a-n. The heat exchanger 202 can also provide the air associated with the one or more air moving devices 116 and/or the one or more air moving devices 122a-n into the two-phase refrigerant loop associated with the condenser 104. For example, the heat exchanger 202 can transfers heat, from coolant refrigerant provided by the heat exchanger 114 and air in the enclosure 102 associated with the one or more air moving devices 116 and/or the one or more air moving devices 122a-n, to the two-phase refrigerant loop associated with the condenser 104. As such, As such, a greater amount of heat generated by the one or more electronic components 112a-n, the one or more electronic components 118a-n and/or the one or more electronic component 120a-n can be captured. Furthermore, the two-phase refrigerant loop with the heat exchanger 202 can provide improved exit vapor quality (e.g., the two-phase refrigerant loop can operate at up to 100% exit vapor quality without any risk of a dry-out condition).

Figure 3:
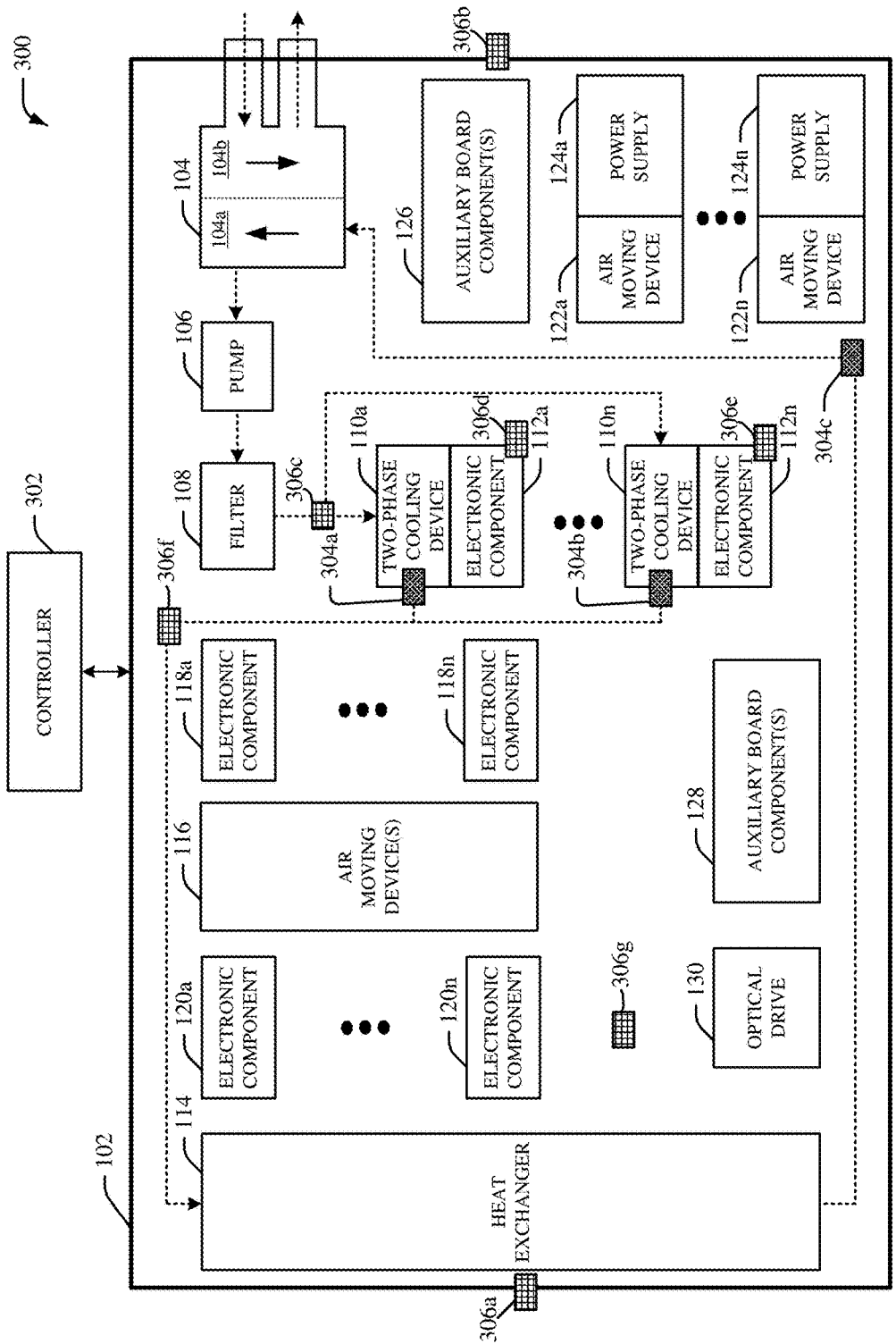
FIG. 3 illustrates a block diagram of yet another example, non-limiting system associated with two-phase liquid cooling in accordance with one or more embodiments described herein.

FIG. 3 illustrates a block diagram of an example, non-limiting system 300 that facilitates two-phase liquid cooling in accordance with one or more embodiments described herein. Repetitive description of like elements employed in other embodiments described herein is omitted for sake of brevity.

The system 300 includes the enclosure 102 and the controller 302. In certain embodiments, the system 300 can include the heat exchanger 202. The controller 302 can regulate one or more control valves (e.g., one or more flow control valves) associated with the two-phase refrigerant loop of the enclosure 102 based on data provided by one or more sensors associated with the enclosure 102. In an embodiment, the enclosure 102 can include a valve 304a, a valve 304b and a valve 304c. Additionally, the enclosure 102 can include a sensor 306a, a sensor 306b, a sensor 306c, a sensor 306d, a sensor 306e, a sensor 306f, a sensor 306g. The valve 304a, the valve 304b and the valve 304c can be control valves associated with the two-phase cooling system of the enclosure 102. For example, the valve 304a can be a control valve in the two-phase refrigerant loop that is located between the two-phase cooling device 110a and the heat exchanger 114, the valve 304b can be a control valve in the two-phase refrigerant loop that is located between the two-phase cooling device 110n and the heat exchanger 114, and the valve 304c can be a control valve in the two-phase refrigerant loop that is located between the heat exchanger 114 and the condenser 104. However, it is to be appreciated that the valve 304a, the valve 304b and/or the valve 304c can be located in a different location within the enclosure 102. Furthermore, it is to be appreciated that the enclosure 102 can include a different number of valves.

The sensor 306a, the sensor 306b, the sensor 306c, the sensor 306d, the sensor 306e, the sensor 306f, and the sensor 306g can be associated with the two-phase cooling system of the enclosure 102 and/or the air moving system of the enclosure 102. For example, the sensor 306a can be a temperature sensor associated with air intake for the heat exchanger 114, the sensor 306b can be a temperature sensor associated with air outtake associated with the enclosure 102, the sensor 306c can be a flow sensor and/or a pressure sensor in the two-phase refrigerant loop that is located between the filter 108 and the one or more two-phase cooling devices 110a-n, the sensor 306d can be a temperature sensor and/or a power usage sensor associated with the electronic component 112a, the sensor 306e can be a temperature sensor and/or a power usage sensor associated with the electronic component 112n, the sensor 306f can be a flow sensor and/or a pressure sensor in the two-phase refrigerant loop that is located between the one or more two-phase cooling devices 110a-n and the heat exchanger 114, and the sensor 306g can be a temperature sensor associated with air within the enclosure 102 (e.g., air associated with the one or more air moving devices 116 and/or the one or more air moving devices 122a-n). As such, the sensor 306a, the sensor 306b, the sensor 306c, the sensor 306d, the sensor 306e, the sensor 306f, and the sensor 306g can be employed to monitor temperature, pressure, power usage and/or flow rate associated with the two-phase cooling system of the enclosure 102 and/or the air moving system of the enclosure 102. It is to be appreciated that the sensor 306a, the sensor 306b, the sensor 306c, the sensor 306d, the sensor 306e, the sensor 306f and/or the sensor 306g can be located in a different location within the enclosure 102. Furthermore, it is to be appreciated that the enclosure 102 can include a different number of sensors.

In an aspect, the controller 302 can regulate the valve 304a, the valve 304b and/or the valve 304c based on data provided by the sensor 306a, the sensor 306b, the sensor 306c, the sensor 306d, the sensor 306e, the sensor 306f and/or the sensor 306g. For instance, the controller 302 can regulate the valve 304a, the valve 304b and/or the valve 304c based on temperature data, pressure data, power data and/or flow rate data provided by the sensor 306a, the sensor 306b, the sensor 306c, the sensor 306d, the sensor 306e, the sensor 306f and/or the sensor 306g. In one example, the controller 302 can alter flow rate of the coolant refrigerant associated with the two-phase refrigerant loop based on temperature data, pressure data, power data and/or flow rate data provided by the sensor 306a, the sensor 306b, the sensor 306c, the sensor 306d, the sensor 306e, the sensor 306f and/or the sensor 306g. In certain embodiments, aspects of the controller 302 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the controller 302 can also include a memory that stores computer executable components and instructions. Furthermore, the controller 302 can include a processor to facilitate execution of the instructions (e.g., computer executable components and corresponding instructions) by the controller 302.

Figure 4:
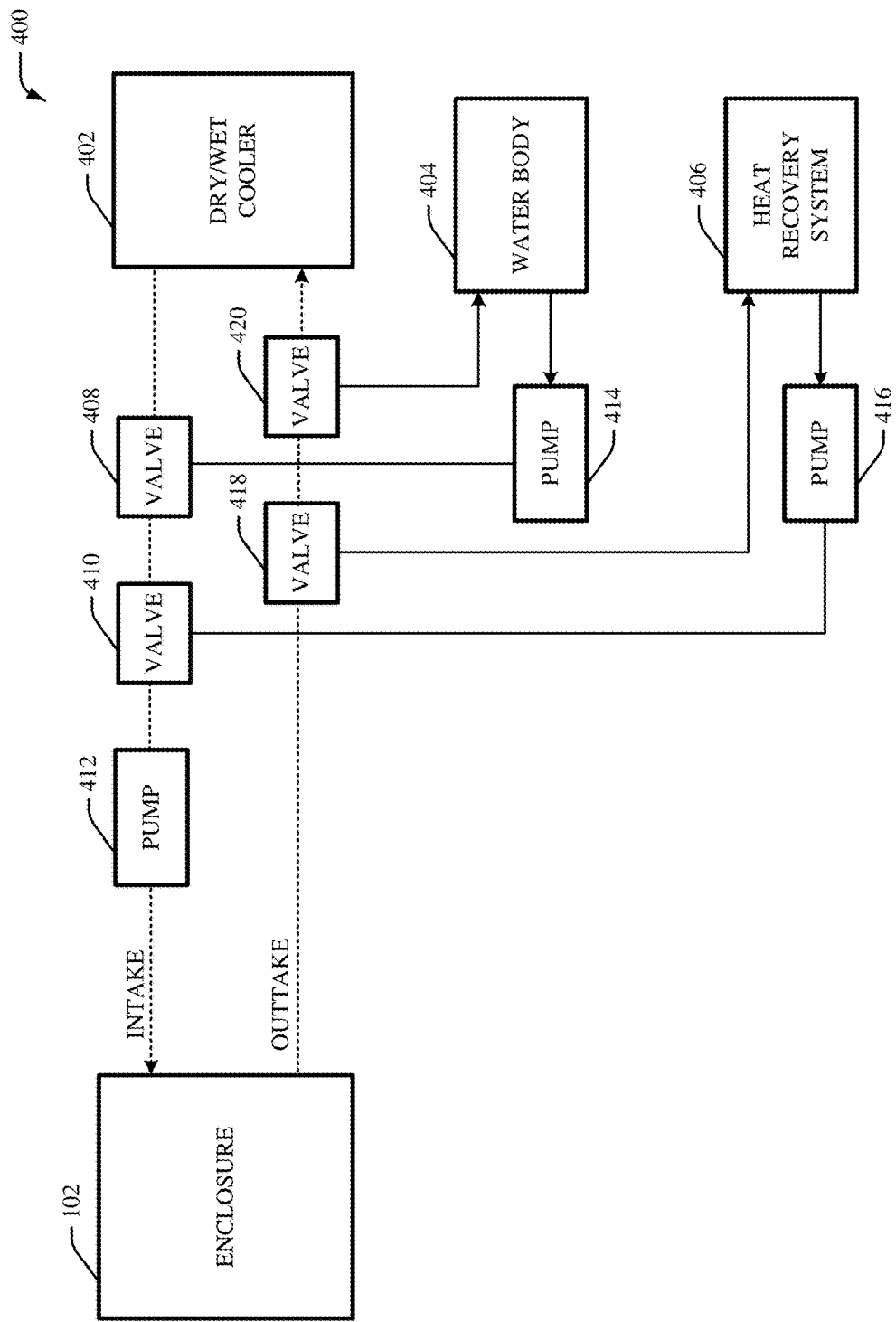
FIG. 4 illustrates a block diagram of yet another example, non-limiting system associated with two-phase liquid cooling in accordance with one or more embodiments described herein.

FIG. 4 illustrates a block diagram of an example, non-limiting system 400 that facilitates two-phase liquid cooling in accordance with one or more embodiments described herein. Repetitive description of like elements employed in other embodiments described herein is omitted for sake of brevity.

The system 400 can include a dry/wet cooler 402, a water body 404, and/or a heat recovery system 406. The dry/wet cooler 402 can be employed to cool (e.g., reduce a temperature of) the condenser 104 in the enclosure 102. In an embodiment, the dry/wet cooler 402 can provide the intake to the enclosure 102 via a valve 408, a valve 410 and a pump 412. For example, the valve 408 and the valve 410 can be configured in an open position to enable a path between the dry/wet cooler 402 and the enclosure 102. In certain embodiments, the pump 412 can be employed to provide a liquid (e.g., water) from the dry/wet cooler 402 to the enclosure 102. In an alternate embodiment, the dry/wet cooler 402 can provide air to the enclosure. Additionally or alternatively, the water body 404 can be employed to cool (e.g., reduce a temperature of) the condenser 104 in the enclosure 102. The water body 404 can be, for example, a body of water such as a lake, a pond, a bay, an outdoor reservoir, a river or another body of water. In an embodiment, the water body 404 can provide the intake to the enclosure 102 via a pump 414, the valve 408, the valve 410 and the pump 412. For example, the valve 408 and the valve 410 can be configured in an open position to enable a path between the water body 404 and the enclosure 102. The pump 414 and the pump 412 can be employed to provide a liquid (e.g., water) from the water body 404 to the enclosure 102. Additionally or alternatively, the heat recovery system 406 can be employed to cool (e.g., reduce a temperature of) the condenser 104 in the enclosure 102. In an embodiment, the heat recovery system 406 can provide the intake to the enclosure 102 via a pump 416, the valve 410 and the pump 412. For example, the valve 408 can be configured in an open position and the valve 410 can be configured in a closed position to enable a path between the heat recovery system 406 and the enclosure 102. The pump 416 and the pump 412 can be employed to provide air from the heat recovery system 406 to the enclosure 102. For instance, the heat recovery system 406 can provide ventilation to the condenser 104 in the enclosure 102 via an air-to-air heat exchanger. In certain embodiments, the enclosure 102 can provide the outtake to the dry/wet cooler 402, the water body 404 and/or the heat recovery system 406. For example, the enclosure 102 can provide the outtake to the dry/wet cooler 402 via a valve 418 and a valve 420. The valve 418 and the valve 420 can be configured in an open position to enable a path between the enclosure 102 and the dry/wet cooler 402. Additionally or alternatively, the enclosure 102 can provide the outtake to the water body 404 via the valve 418 and the valve 420. The valve 418 can be configured in an open position and the valve 420 can be configured in a closed position to enable a path between the enclosure 102 and the water body 404. Additionally or alternatively, the enclosure 102 can provide the outtake to the heat recovery system 406. The valve 418 and the valve 420 can be configured in a closed position to enable a path between the enclosure 102 and the heat recovery system 406.

Figure 5:
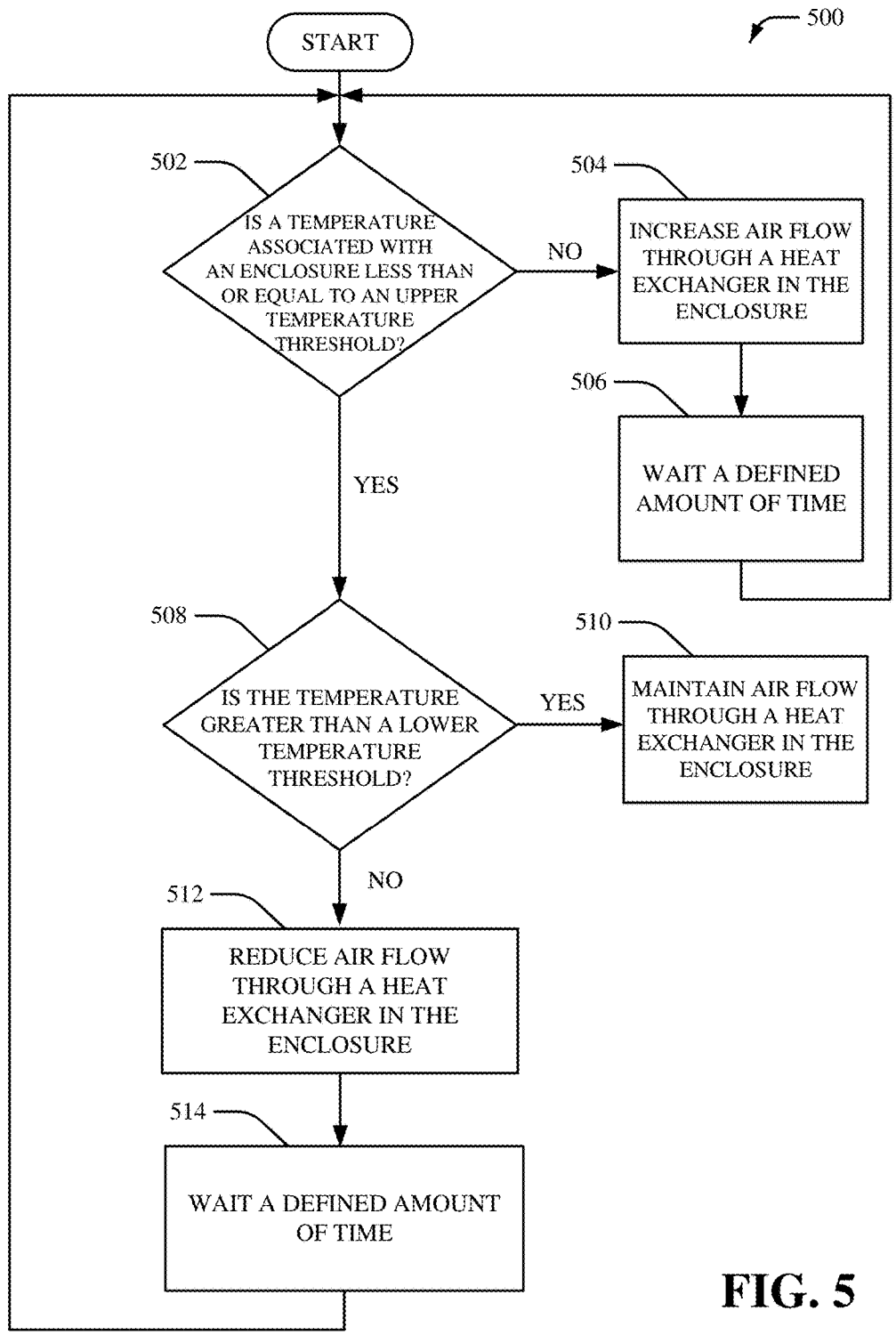
FIG. 5 illustrates a flow diagram of an example, non-limiting method that facilitates control of a temperature within an enclosure in accordance with one or more embodiments described herein.

FIG. 5 illustrates a flow diagram of an example, non-limiting method 500 that facilitates control of a temperature within an enclosure in accordance with one or more embodiments described herein. In an embodiment, the method 500 can be associated with a controller (e.g., controller 302). Repetitive description of like elements employed in other embodiments described herein is omitted for sake of brevity.

At 502, it is determined whether a temperature associated with an enclosure (e.g., enclosure 102) is less than or equal to an upper temperature threshold. For example, it can be determined whether an inlet temperature associated with the enclosure (e.g., a temperature associated with the sensor 306*a* and/or the sensor 306*b*) is less than or equal to the upper temperature threshold. In one example, the upper temperature threshold can be a temperature value where performance of one or more electronic components of the enclosure is negatively impacted (e.g., a temperature value where throttling of one or more electronic components of the enclosure would generally be required). If no, method 500 proceeds to 504. At 504, air flow through a heat exchanger (e.g., heat exchanger 114 and/or heat exchanger 202) in the enclosure is increased. At 506, method 500 can wait a defined amount of time before returning to 502. For example, increased air flow through the heat exchanger can be maintained for the defined amount of time before determining whether or not to alter the air flow through the heat exchanger. If yes, method 500 proceeds to 508.

At 508, it is determined whether the temperature is greater than a lower temperature threshold. For example, it can be determined whether an inlet temperature associated with the enclosure (e.g., a temperature associated with the sensor 306*a* and/or the sensor 306*b*) is greater than the lower temperature threshold. In one example, the lower temperature threshold can be a temperature value to avoid negatively impacting one or more electronic components of the enclosure (e.g., a temperature value where condensation risk associated with one or more electronic components of the enclosure is generally avoided). If yes, method 500 proceed to 510. At 510, air flow through a heat exchanger (e.g., heat exchanger 114 and/or heat exchanger 202) in the enclosure is maintained. If no, method 500 proceeds to 512. At 512, air flow through a heat exchanger (e.g., heat exchanger 114 and/or heat exchanger 202) in the enclosure is decreased. At 514, method 500 can wait a defined amount of time before returning to 502. For example, decreased air flow through the heat exchanger can be maintained for the defined amount of time before determining whether or not to alter the air flow through the heat exchanger.

Figure 6:
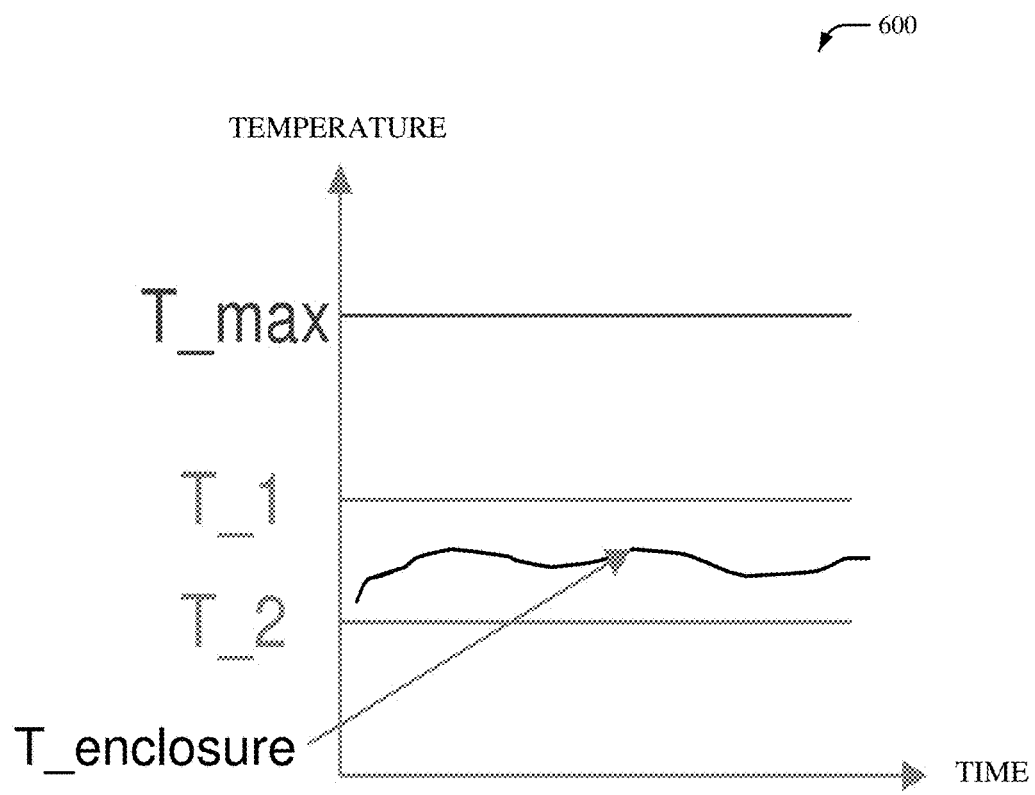
FIG. 6 illustrates an example, non-limiting graph associated with control of a temperature within an enclosure in accordance with one or more embodiments described herein.

FIG. 6 illustrates an example graph 600 associated with control of a temperature within an enclosure in accordance with one or more embodiments described herein. Repetitive description of like elements employed in other embodiments described herein is omitted for sake of brevity.

As shown in FIG. 6, $T\_1$ can represent an upper temperature threshold, $T\_2$ can represent a lower temperature threshold, a $T\_{max}$ can represent a maximum temperature threshold. The upper temperature threshold $T\_1$ can be a temperature value where performance of one or more electronic components of the enclosure 102 (e.g., the one or more electronic components 112*a-n*, the one or more electronic components 118*a-n* and/or the one or more electronic components 120*a-n*) can be negatively impacted. For instance, the upper temperature threshold $T\_1$ can be a temperature value where throttling of one or more electronic components of the enclosure 102 would generally be required. The lower temperature threshold $T\_2$ can be a temperature value to avoid negatively impacting one or more electronic components of the enclosure 102 (e.g., the one or more electronic components 112*a-n*, the one or more electronic components 118*a-n* and/or the one or more electronic components 120*a-n*). For instance, the lower temperature threshold $T\_2$ can be a temperature value where condensation risk associated with one or more electronic components of the enclosure 102 is generally avoided. The maximum temperature threshold $T\_{max}$ can be a temperature value where one or more electronic components of the enclosure 102 (e.g., the one or more electronic components 112*a-n*, the one or more electronic components 118*a-n* and/or the one or more electronic components 120*a-n*) is generally required to be shut down to avoid damage to the one or more electronic components of the enclosure 102. By employing the controller 302 and one or more of the sensors 306*a-g*, a temperature $T\_{enclosure}$ associated with the enclosure 102 can be maintained between the lower temperature threshold $T\_2$ and the upper temperature threshold $T\_1$. For example, the temperature $T\_{enclosure}$ associated with the enclosure 102 can be an inlet temperature for the enclosure 102. In another example, the temperature $T\_{enclosure}$ associated with the enclosure 102 can be a temperature at a location within the enclosure 102.

Figure 7:
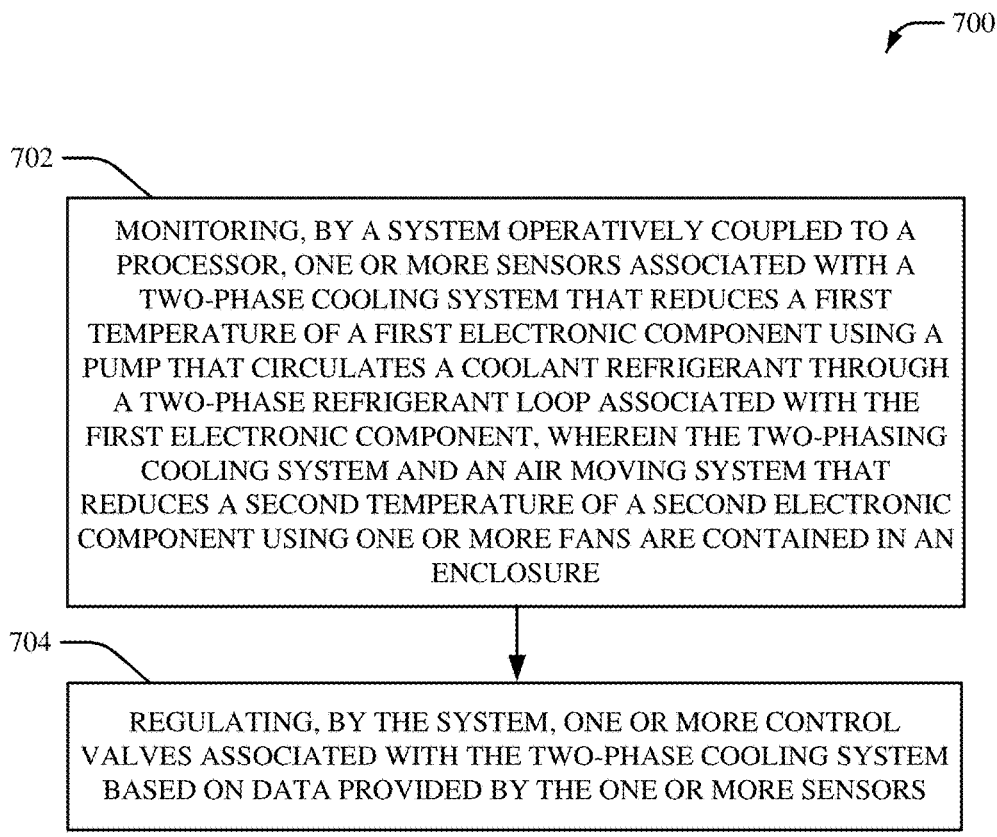
FIG. 7 illustrates a flow diagram of an example, non-limiting method that facilitates two-phase liquid cooling of one or more electronic components in an enclosure in accordance with one or more embodiments described herein.

FIG. 7 illustrates a flow diagram of an example, non-limiting method 700 that facilitates two-phase liquid cooling of one or more electronic components in an enclosure in accordance with one or more embodiments described herein.

Repetitive description of like elements employed in other embodiments described herein is omitted for sake of brevity.

At 702, one or more sensors associated with a two-phase cooling system that reduces a first temperature of a first electronic component using a pump that circulates a coolant refrigerant through a two-phase refrigerant loop associated with the first electronic component is monitored by a system (e.g., controller 302) operatively coupled to a processor. The two-phase cooling system and an air moving system that reduces a second temperature of a second electronic component using one or more fans are contained in an enclosure. In an embodiment, a temperature associated with the two-phase cooling system and/or the air moving system can be monitored. Additionally or alternatively, a flow rate associated with the coolant refrigerant through the two-phase refrigerant loop and/or the air moving system can be monitored. Additionally or alternatively, a pressure associated with the coolant refrigerant through the two-phase refrigerant loop can be monitored. Additionally or alternatively, a power level and/or a temperature associated with the first electronic component can be monitored. At 704, one or more control valves associated with the two-phase cooling system is regulating, by the system (e.g., controller 302), based on data provided by the one or more sensors. For example, the one or more control valves associated with the two-phase cooling system can be regulated based on temperature data, pressure data, flow rate data and/or power level data provided by the one or more sensors. The one or more control valves can, for example, control a flow rate of the coolant refrigerant through the two-phase refrigerant loop.

Figure 8:
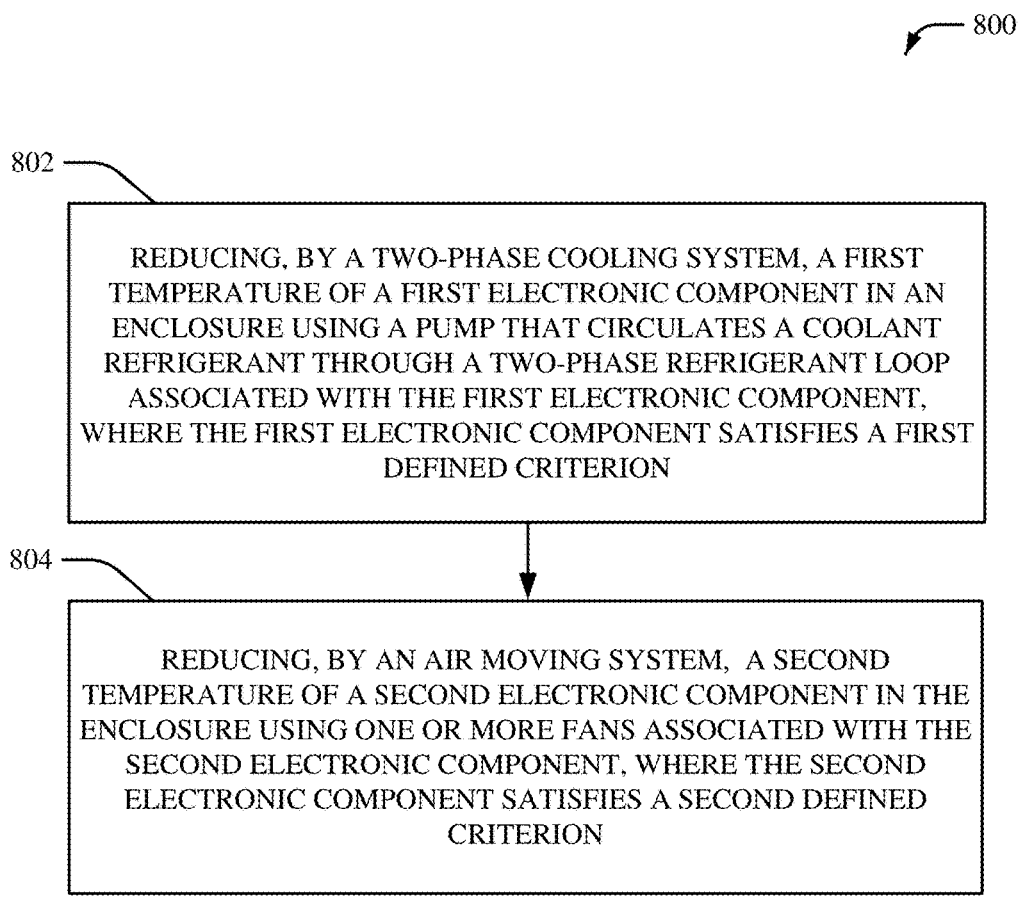
FIG. 8 illustrates a flow diagram of another example, non-limiting method that facilitates two-phase liquid cooling of one or more electronic components in an enclosure in accordance with one or more embodiments described herein.

FIG. 8 illustrates a flow diagram of an example, non-limiting method 800 that facilitates two-phase liquid cooling of one or more electronic components in an enclosure in accordance with one or more embodiments described herein. Repetitive description of like elements employed in other embodiments described herein is omitted for sake of brevity.

At 802, a first temperature of a first electronic component in an enclosure is reduced, by a two-phase cooling system (e.g., by a two-phase cooling system associated with the one or more two-phase cooling devices 110a-n), using a pump that circulates a coolant refrigerant through a two-phase refrigerant loop associated with the first electronic component, where the first electronic component satisfies a first defined criterion. The first defined criterion can be, for example, a criterion associated with a one or more properties of the first electronic component such as, for example, a power dissipation property for the first electronic component, a density of the first electronic component, a geometric dimension for the first electronic component, a structural property for the first electronic component, an electrical property for the first electronic component, power consumption of the first electronic component, or the like.

At 804, a second temperature of a second electronic component in the enclosure is reduced, by an air moving system (e.g., by an air moving system associated with the one or more air moving devices 116 and/or the one or more air moving devices 122a-n), using one or more fans associated with the second electronic component, where the second electronic component satisfies a second defined criterion. The second defined criterion can be, for example, a criterion associated with a one or more properties of the second electronic component such as, for example, a power dissipation property for the second electronic component, a density of the second electronic component, a geometric dimension for the second electronic component, a structural property for the second electronic component, an electrical property for the second electronic component, power consumption of the second electronic component, or the like.

Figure 9:
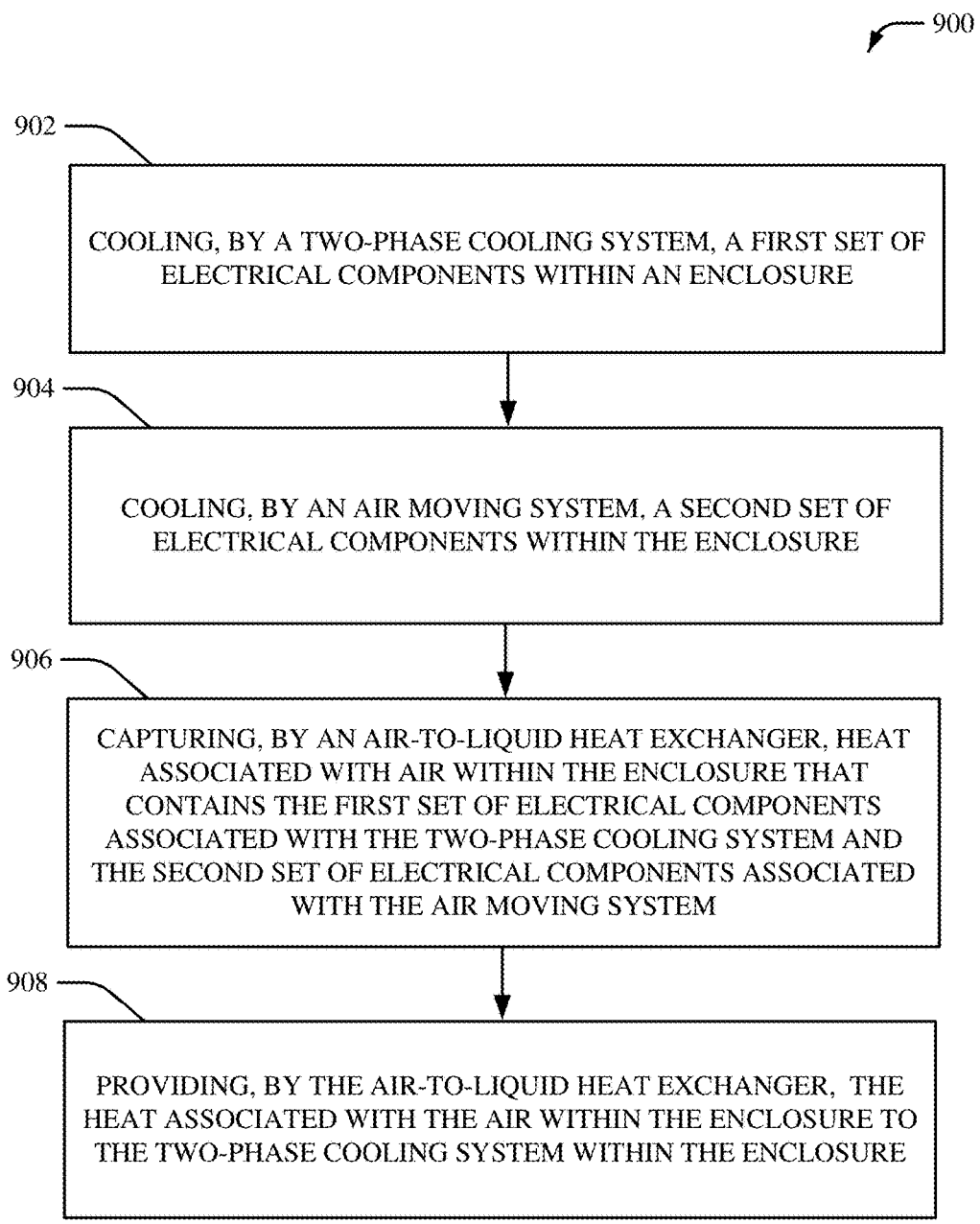
FIG. 9 illustrates a flow diagram of yet another example, non-limiting method that facilitates two-phase liquid cooling of one or more electronic components in an enclosure in accordance with one or more embodiments described herein.

FIG. 9 illustrates a flow diagram of an example, non-limiting method 900 that facilitates two-phase liquid cooling of one or more electronic components in an enclosure in accordance with one or more embodiments described herein. Repetitive description of like elements employed in other embodiments described herein is omitted for sake of brevity.

At 902, a first set of electrical components within an enclosure is cooling by a two-phase cooling system (e.g., by a two-phase cooling system associated with the one or more two-phase cooling devices 110a-n). In one example, the first set of electrical components can be a set of processors (e.g., a set of central processing units, a set of microprocessors, etc.). At 904, a second set of electrical components within the enclosure is cooled by an air moving system (e.g., by an air moving system associated with the one or more air moving devices 116 and/or the one or more air moving devices 122a-n). In one example, the second set of electrical components can be a set of memory devices (e.g., a set of memory modules, a set of hard disk drives, etc.). Additionally or alternatively, the second set of electrical components can be a set of power supply devices. At 906, heat associated with air within the enclosure that contains the first set of electrical components associated with the two-phase cooling system and the second set of electrical components associated with the air moving system is capturing by an air-to-liquid heat exchanger (e.g., by heat exchanger 114 and/or heat exchanger 202). At 908, the heat associated with the air within the enclosure is provided, by the air-to-liquid heat exchanger (e.g., by heat exchanger 114 and/or heat exchanger 202), to the two-phase cooling system within the enclosure.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies could alternatively be represented as a series of interrelated states via a state diagram or events. The flowchart and block diagrams in the Figures illustrate the architecture, functionality, and operation of possible implementations of systems, methods, apparatuses and devices according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

Figure 10:
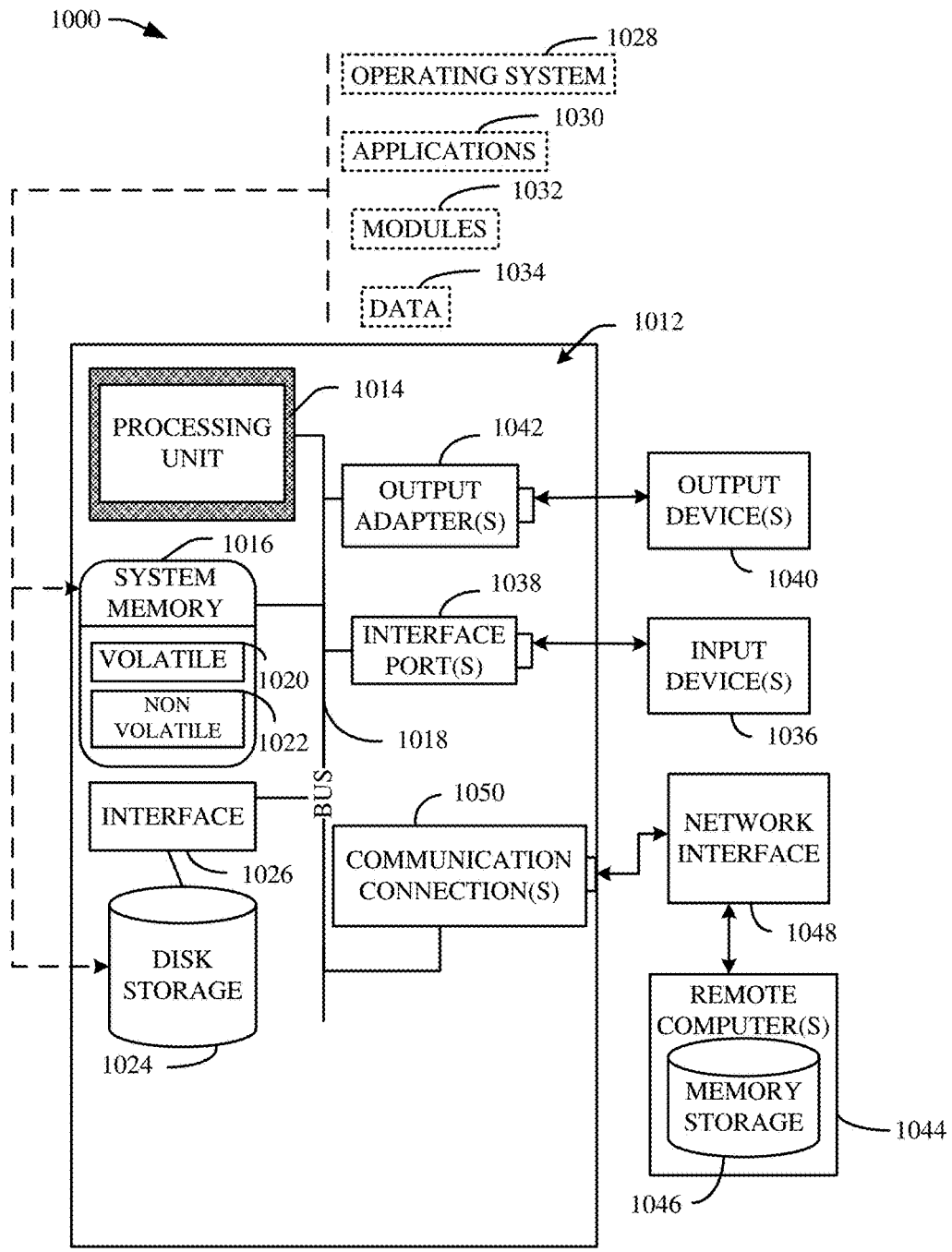
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," "controller," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
   monitoring, by a system operatively coupled to a processor, one or more sensors associated with a two-phase cooling system, wherein the two-phase cooling system reduces a first temperature of a first electronic component using a pump that circulates a coolant refrigerant through a two-phase refrigerant loop associated with the first electronic component, wherein the two-phase cooling system and an air moving system that reduces a second temperature of a second electronic component using one or more fans are contained in an enclosure; and
   regulating, by the system, two or more control valves associated with the two-phase cooling system based on data provided by the one or more sensors, wherein the regulating comprises:

regulating a first control valve of the two or more control valves to control a first flow to a heat exchanger in the enclosure, wherein the first control valve is located between a first two-phase cooling device of the two-phase cooling system and the heat exchanger; and regulating a second control valve of the two or more control valves to control a second flow from the heat exchanger to a condenser in the enclosure, wherein the second control valve is located between the heat exchanger and the condenser.

2. The computer-implemented method of claim 1, wherein the monitoring comprises monitoring a temperature associated with the two-phase cooling system.

3. The computer-implemented method of claim 1, wherein the monitoring comprises monitoring a flow rate associated with the coolant refrigerant through the two-phase refrigerant loop.

4. The computer-implemented method of claim 1, further comprising:

determining, by the system, a temperature associated with an inlet to the enclosure; and identifying, by the system, a flow rate of the coolant refrigerant.

5. The computer-implemented method of claim 4, further comprising:

facilitating, by the system, modifying the flow rate of the coolant refrigerant based on the temperature.

6. The computer-implemented method of claim 1, further comprising:

determining, by the system, a temperature associated with an inlet to the enclosure.

7. The computer-implemented method of claim 6, further comprising:

identifying, by the system, a flow rate of the coolant refrigerant.

8. The computer-implemented method of claim 1, further comprising:

facilitating, by the system, modifying the flow rate of the coolant refrigerant based on the first temperature.

9. A computer-implemented method, comprising:

monitoring, by a system operatively coupled to a processor, one or more sensors associated with a two-phase cooling system that reduces a first temperature of a first electronic component using a pump that circulates a coolant refrigerant through a two-phase refrigerant loop associated with the first electronic component;

regulating a first control valve of two or more control valves to control a first flow from a first two-phase cooling device to a heat exchanger in the enclosure; and regulating a second control valve of the two or more control valves to control a second flow from the heat exchanger to a condenser in an enclosure.

10. The computer-implemented method of claim 9, wherein the monitoring comprises monitoring a temperature associated with the two-phase cooling system.

11. The computer-implemented method of claim 9, wherein the monitoring comprises monitoring a flow rate associated with the coolant refrigerant through the two-phase refrigerant loop.

\* \* \* \* \*